(12) United States Patent
Ranish

(10) Patent No.: US 10,665,484 B2
(45) Date of Patent: May 26, 2020

(54) SUPPORT RING WITH ENCAPSULATED LIGHT BARRIER

(71) Applicant: Applied Materials, Inc., Santa Clara, CA (US)

(72) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 428 days.

(21) Appl. No.: 15/724,049

(22) Filed: Oct. 3, 2017

(65) Prior Publication Data

US 2018/0047597 A1    Feb. 15, 2018

Related U.S. Application Data

(62) Division of application No. 14/472,871, filed on Aug. 29, 2014, now Pat. No. 9,793,145.

(60) Provisional application No. 61/884,776, filed on Sep. 30, 2013.

(51) Int. Cl.
*H01L 21/67* (2006.01)

(52) U.S. Cl.
CPC .. *H01L 21/67115* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 5,818,137 A | * | 10/1998 | Nichols | F16C 32/0448 310/90.5 |
| 5,871,588 A | * | 2/1999 | Moslehi | C23C 16/4584 118/500 |
| 6,157,106 A | * | 12/2000 | Tietz | F16C 32/047 118/730 |
| 6,262,397 B1 | | 7/2001 | Yazawa | |
| 6,280,183 B1 | | 8/2001 | Mayur et al. | |
| 6,376,804 B1 | * | 4/2002 | Ranish | H01L 21/67115 118/724 |
| 6,464,825 B1 | * | 10/2002 | Shinozaki | C23C 16/4584 118/724 |

(Continued)

FOREIGN PATENT DOCUMENTS

CN    1574208 A    2/2005
CN    1922457 A    2/2007

(Continued)

OTHER PUBLICATIONS

Taiwan Invention Patent Application No. 103130146, Search Report, 2 pages.

(Continued)

*Primary Examiner* — Thor S Campbell
(74) *Attorney, Agent, or Firm* — Patterson + Sheridan LLP

(57) ABSTRACT

Embodiments described herein provide a thermal processing apparatus with a heat source and a rotating substrate support opposite the heat source, the rotating substrate support comprising a support member with a light blocking member. The light blocking member may be an encapsulated component, or may be movably disposed inside the support member. The light blocking member may be opaque and/or reflective, and may be a refractory metal.

20 Claims, 2 Drawing Sheets

(56) References Cited

U.S. PATENT DOCUMENTS

| | | | |
|---|---|---|---|
| 8,658,947 B2 * | 2/2014 | Sorabji | C30B 31/14 118/50.1 |
| 2004/0250772 A1 | 12/2004 | Ramamurthy et al. | |
| 2005/0118797 A1 | 6/2005 | Takagi et al. | |
| 2005/0191044 A1 * | 9/2005 | Aderhold | F27B 17/0025 392/418 |
| 2006/0066193 A1 * | 3/2006 | Ranish | H01L 21/67115 313/116 |
| 2007/0104470 A1 * | 5/2007 | Aderhold | F27B 17/0025 392/422 |
| 2008/0142497 A1 | 6/2008 | Sorabji et al. | |
| 2009/0041443 A1 * | 2/2009 | Aderhold | F27B 17/0025 392/411 |
| 2009/0274454 A1 * | 11/2009 | Aderhold | H01L 21/324 392/416 |
| 2009/0298300 A1 * | 12/2009 | Ranish | H01L 21/324 438/795 |
| 2013/0193132 A1 * | 8/2013 | Serebryanov | H01L 21/67115 219/385 |
| 2013/0323936 A1 * | 12/2013 | Ranish | H05B 3/00 438/795 |
| 2014/0330422 A1 * | 11/2014 | Ranish | G05D 23/27 700/121 |
| 2016/0111306 A1 * | 4/2016 | Ranish | H01L 21/67115 392/416 |
| 2018/0340832 A1 * | 11/2018 | Hawrylchak | G01J 5/0007 |
| 2020/0021166 A1 * | 1/2020 | Nussbaumer | H02K 7/14 |

FOREIGN PATENT DOCUMENTS

| | | |
|---|---|---|
| CN | 102017102 A | 4/2011 |
| JP | 2004079985 A | 3/2004 |
| KR | 1020080028541 A | 4/2008 |
| KR | 1020110044354 A | 4/2011 |
| TW | 201131681 A | 9/2011 |
| TW | 201133633 A | 10/2011 |
| TW | 201306144 A | 2/2013 |

OTHER PUBLICATIONS

International Search Report and Written Opinion for Application No. PCT/US2014/052928 dated Dec. 16, 2014; 10 pages.

Chinese Patent Application No. 201480049632.5, Office Action/ Search Report, 9 pages.

Chinese Patent Application No. 201710619566.6, Office Action/ Search Report, 10 pages, Jan. 20, 2020.

* cited by examiner

SUPPORT RING WITH ENCAPSULATED LIGHT BARRIER

CROSS-REFERENCE TO RELATED APPLICATIONS

This application is a Divisional of U.S. patent application Ser. No. 14/472,871, filed Aug. 29, 2014, which claims benefit of U.S. Provisional Patent Application Ser. No. 61/884,776 filed Sep. 30, 2013, which is incorporated herein by reference.

FIELD

Embodiments described herein relate generally to thermal treatment of semiconductor substrates. More specifically, embodiments described herein relate to apparatus and methods of controlling light noise in a thermal processing chamber.

BACKGROUND

Thermal processing is common in the semiconductor industry. Thermal treatments are used to activate chemical and physical changes in semiconductor substrates to reorganize the atomic structure and composition of the substrate. In a commonly used approach known as Rapid Thermal Processing, the substrate is heated to a target temperature at a rate up to 400° C./sec, held at the target temperature for a short time such as 1 sec, and then rapidly cooled to a temperature below which no further changes occur.

To promote uniform processing of all areas of the substrate, temperature sensors are commonly deployed to monitor temperature at various locations of the substrate. Pyrometers are widely used to measure the temperature of the substrate. Control and measurement of substrate temperature, and therefore of local layer formation conditions, is complicated by thermal absorptions and light emissions by chamber components and exposure of sensors and chamber surfaces to processing conditions inside the processing chamber. There remains a need for a thermal processing chamber with improved temperature control, temperature measurement, and methods of operating such a chamber to improve uniformity and repeatability.

SUMMARY

Embodiments described herein provide a thermal processing apparatus with a heat source and a rotating substrate support opposite the heat source, the rotating substrate support comprising a support member with a light blocking member. The light blocking member may be an encapsulated component, or may be movably disposed inside the support member. The light blocking member may be opaque and/or reflective, and may be a refractory metal.

Embodiments described herein further provide a support member for a rotating substrate support in a thermal processing chamber, the support member having a magnetic rotor, a wall connected to the magnetic rotor, the wall and the magnetic rotor cooperatively defining an internal volume, and a light blocking member movably disposed inside the internal volume. The light blocking member may be a metal sheet with an expansion joint, and the wall may have positioners that position the metal sheet within the internal volume.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
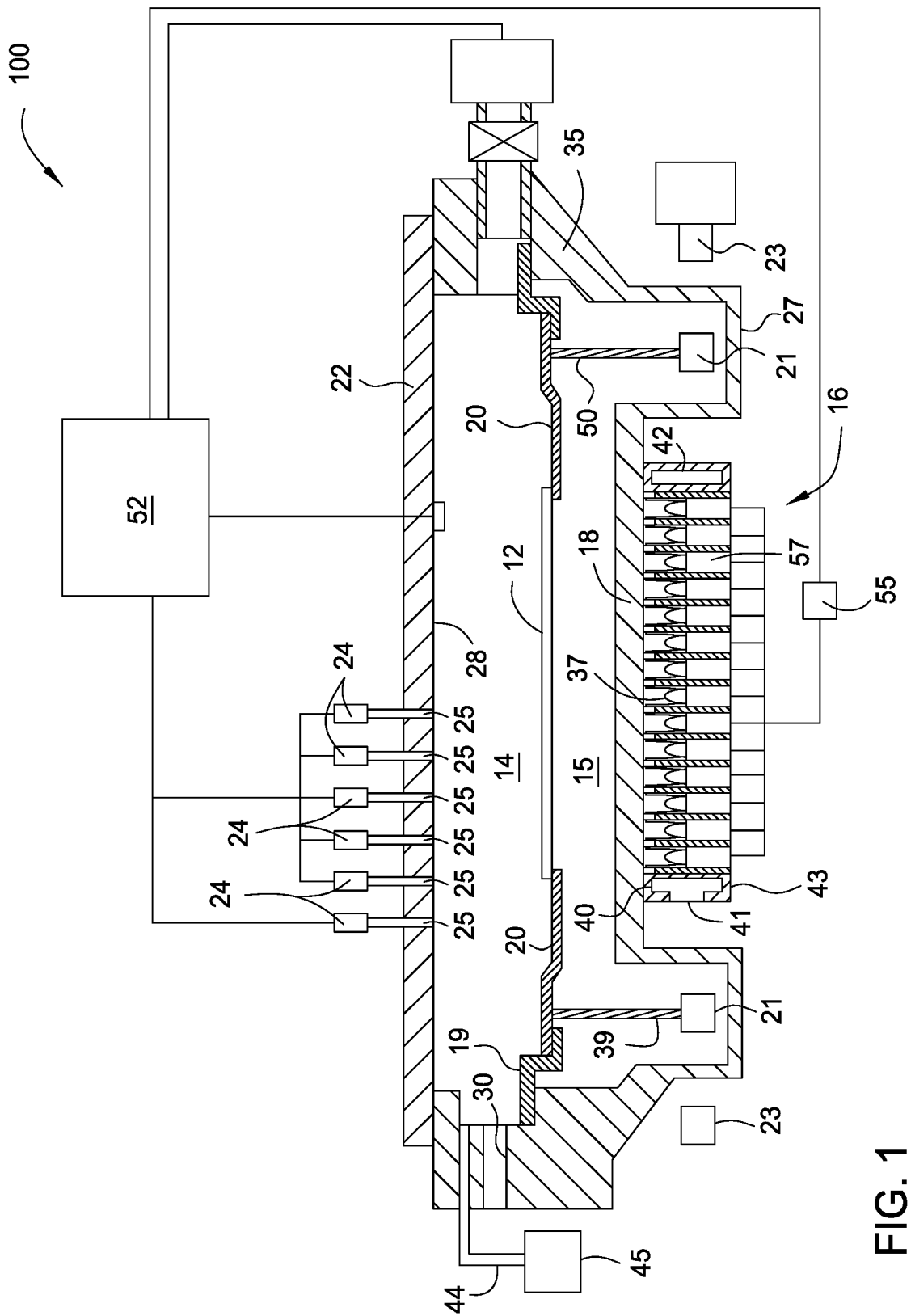
FIG. 1 is a cross-sectional view of a thermal processing chamber according to one embodiment.

FIG. 1 is a cross-sectional view of a thermal processing chamber 100 according to one embodiment. The thermal processing chamber 100 comprises a chamber body 35 defining a processing volume 14 configured for processing a substrate 12 therein. The chamber body 35 may be made of stainless steel and may be lined with quartz. The processing volume 14 is configured to be radiantly heated by a heating lamp assembly 16 disposed adjacent to a quartz window 18. In one embodiment, the quartz window 18 may be water cooled.

A slit valve 30 may be formed on a side of the chamber body 35 providing a passage for the substrate 12 to the processing volume 14. A gas inlet 44 may be connected to a gas source 45 to provide processing gases, purge gases and/or cleaning gases to the processing volume 14. A vacuum pump 13 may be fluidly connected to the processing volume 14 through an outlet 11 for pumping out the processing volume 14.

A circular channel 27 is formed near the bottom of the chamber body 35. A magnetic rotor 21 may be disposed in the circular channel 27. A support member 39 may rest on, or be coupled to, the magnetic rotor 21. The substrate 12 may be supported at a peripheral edge thereof by an edge ring 20 disposed on the support member 39. A magnetic stator 23 may be located externally of the magnetic rotor 21 and may be magnetically coupled through the chamber body 35 to induce rotation of the magnetic rotor 21 and hence of the edge ring 20 and the substrate 12 supported thereon. The magnetic stator 23 may be also configured to adjust the elevations of the magnetic rotor 21, thus lifting the substrate 12 being processed.

The chamber body 35 may include a reflector 22 positioned facing the substrate 12. The reflector 22 has an optically reflective surface 28 facing the substrate 12 to enhance the emissivity of the substrate 12. In one embodiment, the reflector 22 is water cooled. The reflective surface 28 and the surface of the substrate 12 define a processing volume 14. In one embodiment, the reflector 22 may have a diameter slightly larger than the diameter of the substrate 12 being processed. For example, if the thermal processing chamber 100 is configured to process 12 inch diameter circular substrates, the reflector 22 may have a diameter of about 13 inches. In other embodiments, the reflector 22 may have a diameter less than the diameter of the substrate 12.

In one embodiment, an outer ring 19 may be coupled between the chamber body 35 and the edge ring 20 to separate the processing volume 14 from a heating zone 15.

The heating zone 15 is defined by the substrate 12 and a heating lamp assembly 16 positioned opposite the substrate 12 from the reflector 22. The heating lamp assembly 16 may comprise an array of heating elements 37. The array of heating elements 37 may be UV lamps, halogen lamps, laser diodes, resistive heaters, microwave powered heaters, light emitting diodes (LEDs), or any other suitable heating elements both singly or in combination. The array of heating elements 37 may be disposed in holes formed in a reflector body 43.

In one embodiment, the heating elements 37 may be arranged in a hexagon pattern. A cooling channel 40 may be formed in the reflector body 43. A coolant, such as water, may enter the reflector body 43 from an inlet 41, travel adjacent the vertical holes cooling the array of heating elements 37, and exit the reflector body 43 from an exit 42. "Vertical", in this application, generally means a direction perpendicular to a plane defined by the substrate 12 or the quartz window 18. "Vertical" is not an absolute direction relative to gravity or to the surface of the earth, but is relative to symmetries of the chamber 100, and may be parallel to an axis of the chamber 100. Likewise, "horizontal" is generally perpendicular to "vertical", but is not an absolute direction.

The array of heating elements 37 are connected to a controller 52 which adjusts heating effects of the array of heating elements 37. In one embodiment, the array of heating elements 37 may be divided into a plurality of heating groups to heat the substrate 12 by multiple concentric zones. Each heating group may be controlled independently to provide desired temperature profile across a radius of the substrate 12. In one embodiment, each of the zone groups 57 is connected to a power source 55 that individually controls each zone.

A plurality of temperature probes 24 may be coupled to the reflector 22 through a plurality of openings 25 in the reflector 22, one opening for each temperature probe 24. The temperature probes 24 may include one or more pyrometers that sense thermal radiation emitted by the substrate 12, and send a signal representing temperature to the controller 52. The controller 52 may control the heating zone groups 57 according to a signal from a corresponding temperature probe 24.

The support member 39 may be made from quartz, and may be translucent. In one embodiment, much of the support member 39 is bubble quartz, or another white translucent material. With a bubble quartz material, light that contacts an inner surface 50 of the support member 39 propagates throughout the support member 39. When the edge ring 20 is elevated above the outer ring 19 during processing, the transmitted light may propagate into the processing volume 14 and effectively blind, or reduce the effectiveness of, pyrometers that may be used as the temperature probes 24.

To reduce light transmission to the processing volume 14, the support member 39 may include a light blocking member. The light blocking member blocks light from being transmitted through the support member 39. The light blocking member may be an opaque member and/or a reflective member. The support member 39 may include a light blocking member that is not adhered to any surface of the support member 39. In one aspect, the light blocking member may be encapsulated in the support member 39, and may be movably disposed inside the support member 39.

Figure 2:
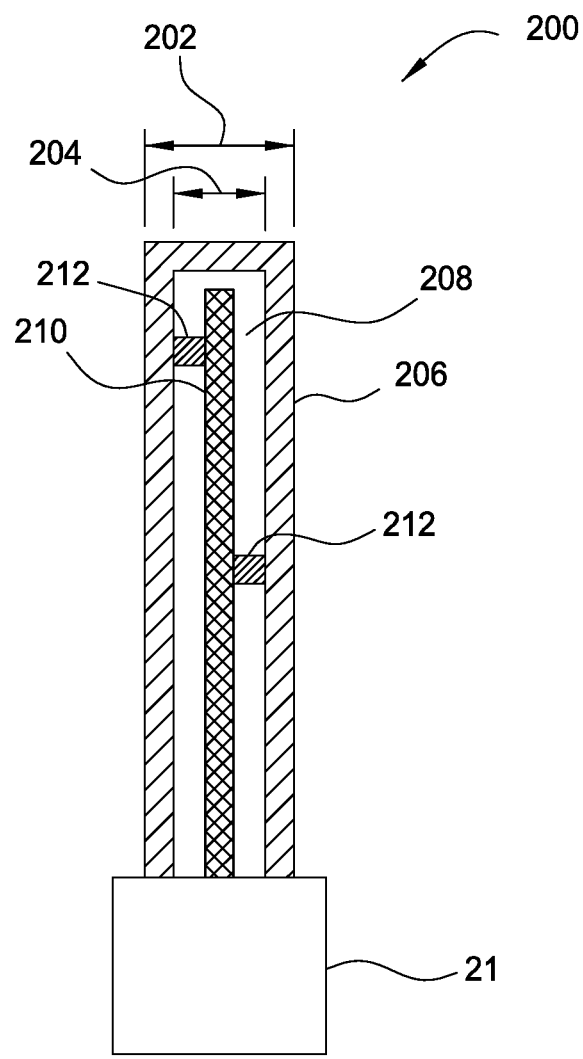
FIG. 2 is a cross-sectional view of a support member according to another embodiment.

FIG. 2 is a cross-sectional view of a support member 200 according to another embodiment. The support member 200 may be used as the support member 39 in the apparatus of FIG. 1.

The support member 200 has a wall 206 that defines an internal volume 208. A light blocking member 210 may be disposed in the internal volume 208, such that the light blocking member 210 is movably disposed inside the internal volume 208. The internal volume 208 has a dimension 204 that is larger than a thickness of the light blocking member 210 such that a gap may be maintained between the light blocking member 210 and the wall 206 on either side of the light blocking member 210. The wall 206 has a thickness that provides thermal insulation between the heating zone 15 and the internal volume 208, such that the thermal exposure of the light blocking member 210 is reduced. The support member 200 thus has an overall thickness 202 that is between about 0.1 cm and about 3.0 cm. The support member 200 may have the shape of a right circular cylinder, and typically surrounds the lamp assembly 16 (FIG. 1). The wall 206 of the support member 200 may be formed from quartz, and may be transparent or translucent. In one embodiment, the wall 206 is bubble quartz. In one embodiment, the support member 200 may be flange-shaped with a vertical wall section and a radial extension that may be an inward radial extension. The vertical wall section and the radial extension may be made as one unitary piece or as two or more separate pieces that may be fused together or otherwise connected, or may movably contact each other. In such an embodiment, the edge ring 20 of FIG. 1 would rest on the radial extension. For example, an outer edge of the edge ring 20 may rest on an inner edge of the radial extension.

In an embodiment where the support member 200 is made of two or more separate pieces, a light labyrinth may be provided at the surfaces where the two or more pieces contact. Such a light labyrinth may include interlocking grooves or hills that provide a tortuous path to defeat light leakage through the interface between the pieces.

The light blocking member 210 may be a metal sheet disposed inside the internal volume 208. The light blocking member 210 is typically substantially opaque to light emitted by the lamp assembly 16 (FIG. 1), and the light blocking member 210 may be reflective or partially reflective. The light blocking member 210 may be substantially smooth and flat, generally following any contours of the support member 200, or the light blocking member 210 may have contours independent of any contours of the support member 200. For example the light blocking member 210 may have light scattering features such as corrugations or surface textures. The light blocking member 210 typically has a thickness between about 0.5 mm and about 5 mm, so in some embodiments, the light blocking member 210 may be a metal foil, while in other embodiments the light blocking member 210 may be a metal sheet. The light blocking member 210 may be attached to the magnetic rotor 21 or may merely rest on the magnetic rotor 21. The light blocking member 210 may also be a particulate film comprising metal or graphite particles. Metal particles such as tungsten may be used.

The support member 200 may be made by welding together two cylindrical members having different radii at a top portion of each member to form the wall 206 with the internal volume 208. The light blocking member 210 may be metal, and is typically heat resistant. The two cylindrical members may be welded together at a bottom portion thereof, leaving a slot at the top portion of the fused cylindrical members. The light blocking member 210 may then be slipped into the slot, and the slot closed at the top portion of the cylindrical members. Following closure, the volume 208 may have an internal pressure between about 1

μTorr and about 10 Torr. A getter may be included in the internal volume, if desired, to maintain vacuum as gases leak into the internal volume 208 from the heating zone 15. For example, a zirconium compound may be included in the volume 208 to adsorb hydrogen gas. A port may be included in a desired location of the support member 200 for filling the support member 200 with gas and evacuating gas from the support member 200. For example, a fill tube may be inserted into the slot at the top portion before the slot is welded closed.

In certain embodiments, the light blocking member 210 may comprise a plurality of sections (not shown). In this embodiment, the plurality of sections may be positioned to overlap where the sections are adjacent one another. In another embodiment, the plurality of sections may not overlap but may be positioned in a manner such that substantially no radiation may penetrate a gap between the plurality of portions when the reflective member is exposed to radiation. In either embodiment, the spacing and location of the light blocking member 210 may account for expansion of the light blocking member 210 during exposure to radiation. More specifically, the positioning of the light blocking member 210 may be selected to accommodate for physical movement of the light blocking member 210 under thermal stress. In another embodiment, the light blocking member 210 may be a single unitary piece with an expansion joint (not shown) where two edges of the light blocking member 210 may overlap to maintain a light seal during thermal expansion and contraction of the light blocking member 210.

The light blocking member 210 may be a specular reflector such that light provided to the light blocking member 210 has angle of incidence which equals the angle of reflection. The light blocking member 210 may be a broadband reflector such as a metallic reflector or a dielectric film stack, or a combination thereof. In certain embodiments, the light blocking member 210 may be coated by or encased in a transparent barrier material, such as silica. In one example, the light blocking member 210 may be formed from a dielectric stack comprising silica ($SiO_2$), titania ($TiO_2$), tantalum oxide ($Ta_2O_5$), or combinations thereof. In another example, the light blocking member 210 may be formed from a metal selected to withstand processing temperatures. Examples include aluminum, gold, silver, platinum, tungsten, tantalum, titanium, or combinations thereof.

In certain embodiments, surfaces defining the volume 208 may be coated with a reflective material. For example, every surface defining the volume 208 may be coated with a reflective material. The surfaces may be coated with a reflective material by electroless plating, such as electroless nickel or electroless silver plating. Prior to closing the volume 208, the volume 208 may be filled with an aqueous plating solution and the electroless plating process may proceed to plate the surfaces defining the volume 208 with nickel, silver, gold, copper, or another reflective material. After the electroless plating process, the aqueous solution is evacuated from the volume 208 and the volume 208 is closed by a quartz weld. In this embodiment, the volume 208 may be provided under vacuum similar to previously described embodiments. The surfaces defining the volume 208 coated with the reflective material may act as a specular reflector.

In other embodiments, surfaces defining the volume 208 may be coated with an absorbing material. For example, every surface defining the volume 208 may be coated with an absorbing material. The surfaces may be coated by applying a suspension of particles or a sol. Prior to closing the volume 208, the volume 208 may be filled with a suspension of absorbing particles or sol in a fluid carrier. After removing the fluid carrier by evaporation and depositing the particles on the surfaces, optionally aided by heating to remove any suspension additives, or by heat with a redox agent to set the oxidation state of the particles, the volume 208 is closed by a quartz weld. In this embodiment, the volume 208 may be provided under vacuum similar to previously described embodiments. Suitable suspensions include graphite suspensions (e.g. Aquadag™, ICI), ceramic suspensions (e.g. HiE-Coat™ 840-C, Aremco). Suitable sols include those based on metal alkoxides and tungsten oxides which can be reduced to the metallic state if desired.

The support member 200 may include one or more positioners 212, for example a plurality of positioners 212, that maintain the light blocking member 210 is a spaced apart relationship with respect to all portions of the wall 206. The positioners 212 protrude from the wall 206 into the internal volume 208. The positioners 212 may be sized to place the light blocking member 210 at a certain desired distance from one portion of the wall 206, or in contact with a portion of the wall 206. For example, the positioners 212 may traverse the entire distance between the wall 206 and the light blocking member 210 such that the light blocking member is constrained from moving in a direction toward the wall. Alternately, the positioners 212 may traverse partway between the wall 206 and the light blocking member 210 such that the light blocking member 210 retains freedom to move in a direction toward the wall 206.

The positioners 212 may be arranged on the same side of the light blocking member 210, or distributed on both sided of the light blocking member 210 according to any desired scheme. The positioners 212 act as restraints on movement of the light blocking member 210 toward the wall 206, and may prevent the light blocking member 210 from touching the wall 206. Such an arrangement may maintain an additional thermal barrier between the heating zone 15 (FIG. 1) and the light blocking member 210. The position of the light blocking member 210 within the internal volume 208 may thus be selected to provide a vacuum barrier between the light blocking member 210 and the wall 206. Dimensions of the vacuum barrier may additionally be selected by specifying the length of the positioners 212.

The positioners 212 may be formed as an integral part of the wall 206, or they may be welded to the wall 206 before insertion of the light blocking member 210. Any number of positioners 212 may be used, and the positioners 212 may be aligned vertically, as shown in FIG. 2, and/or horizontally, or the positioners 212 may have a staggered arrangement so that the positioners 212 do not align. The positioners 212 may have a rounded contact surface that touches the light blocking member 210 to avoid any friction damage to either the light blocking member 210 or the positioners 212.

As noted above in connection with FIG. 1, the support member 39 (which may be the support member 200 of FIG. 2) surrounds the lamp assembly 16. The support member 39 may be substantially continuous, contacting the edge ring 20 at every point around a circumference of the support member 39, or the support member 39 may contact the edge ring 20 discontinuously or periodically. If desired, the support member 39, and/or the light blocking member encapsulated therein (for example the light blocking member 210 of FIG. 2), may have one or more openings to transmit a light sample from the heating zone 15 through the support member 39. A detector may be disposed outside the support member 39 to detect the transmitted light, providing a means for detecting rotational position of the support member 39 and, by extension, the substrate 12. The detector may be photodiode, or any suitable light detector, and may be positioned in the circular channel 27. As the light transmitted through the opening illuminates the detector, the detector may register the position of the substrate support.

While the foregoing is directed to embodiments of the present invention, other and further embodiments of the invention may be devised without departing from the basic scope thereof, and the scope thereof is determined by the claims that follow.

The invention claimed is:

1. A support member for a rotatable substrate support in a thermal processing chamber, the support member comprising:
    a magnetic rotor;
    a wall connected to the magnetic rotor, the wall and the magnetic rotor cooperatively defining an internal volume; and
    a light blocking member movably disposed inside the internal volume.

2. The support member of claim 1, wherein the light blocking member is a metal sheet.

3. The support member of claim 2, wherein the wall comprises a plurality of positioners.

4. The support member of claim 3, wherein the wall is a translucent material and the metal sheet is a material selected from the group consisting of aluminum, gold, silver, platinum, tungsten, tantalum, titanium, and combinations thereof.

5. The support member of claim 1, wherein the light blocking member is a specular reflector.

6. The support member of claim 5, wherein the light blocking member includes metal.

7. The support member of claim 1, wherein the light blocking member comprises a refractory metal.

8. A support member for a thermal processing chamber, comprising:
    a wall defining an internal volume; and
    a light blocking member movably disposed in the internal volume, wherein the light blocking member comprises a refractory metal.

9. The support member of claim 8, wherein the light blocking member is a specular reflector.

10. The support member of claim 9, wherein the wall comprises one or more positioners protruding into the internal volume.

11. The support member of claim 10, wherein the light blocking member is a metal sheet.

12. The support member of claim 11, wherein the metal sheet has light scattering surface features.

13. The support member of claim 11, wherein the light blocking member is coated with a transparent barrier material.

14. The support member of claim 8, wherein the light blocking member is opaque.

15. The support member of claim 8, wherein the light blocking member comprises a material selected from the group consisting of tungsten, tantalum, titanium, and combinations thereof.

16. A support member comprising:
    a magnetic rotor;
    a translucent wall connected to the magnetic rotor, the wall and the magnetic rotor cooperatively defining an internal volume; and
    a metallic light blocking member movably disposed inside the internal volume, the light blocking member having light scattering surface features.

17. The support member of claim 16, wherein the wall comprises one or more positioners protruding into the internal volume.

18. The support member of claim 16, wherein the metallic light blocking member is a metal sheet.

19. The support member of claim 18, wherein the metal sheet is a material selected from the group consisting of aluminum, gold, silver, platinum, tungsten, tantalum, titanium, and combinations thereof.

20. The support member of claim 18, wherein the light blocking member comprises a refractory metal.

* * * * *